United States Patent
Obata

(10) Patent No.: US 7,970,034 B2
(45) Date of Patent: Jun. 28, 2011

(54) LASER DIODE DEVICE

(75) Inventor: Toshiyuki Obata, Miyagi (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 12/692,098

(22) Filed: Jan. 22, 2010

(65) Prior Publication Data
US 2010/0226403 A1 Sep. 9, 2010

(30) Foreign Application Priority Data

Mar. 5, 2009 (JP) ................................. 2009-051959

(51) Int. Cl.
*H01S 5/00* (2006.01)

(52) U.S. Cl. ............... 372/45.01; 372/43.01; 372/44.01; 372/46.01

(58) Field of Classification Search ............... 372/43.01, 372/44.01, 45.01
See application file for complete search history.

(56) References Cited

U.S. PATENT DOCUMENTS 7,606,278 B2 * 10/2009 Kuramoto ............... 372/45.01
2007/0110112 A1 * 5/2007 Sugiura .................. 372/43.01

FOREIGN PATENT DOCUMENTS

JP 2007-300016 11/2007

* cited by examiner

*Primary Examiner* — Dung T Nguyen
(74) *Attorney, Agent, or Firm* — Oblon, Spivak, McClelland, Maier & Neustadt, L.L.P.

(57) ABSTRACT

A laser diode device with which a low voltage is realized is provided. The laser diode device includes: a substrate; a semiconductor laminated structure including a first conductive cladding layer, an active layer, and a second conductive cladding layer on one face side of the substrate and having a contact layer as the uppermost layer, in which a protrusion is formed in the contact layer and the second conductive cladding layer; and an electrode provided on the contact layer. The contact layer has a concavo-convex structure on a face on the electrode side, and the electrode is contacted with the contact layer at contact points of a top face, a side face, and a bottom face of the concavo-convex structure.

8 Claims, 12 Drawing Sheets

US 7,970,034 B2

LASER DIODE DEVICE

BACKGROUND OF THE INVENTION

1. Field of the Invention

The present invention relates to a laser diode device particularly suitable for a ridge type laser diode.

2. Description of the Related Art

In the past, the ridge type laser diode in which a current confinement is made by forming a strip-shaped protrusion (ridge) in a p-side contact layer and a p-type cladding layer correspondingly to a current injection region of an active layer has been known (for example, see Japanese Unexamined Patent Application Publication No. 2007-300016).

SUMMARY OF THE INVENTION

In such an existing ridge-type laser diode, in order to realize a low voltage, it is necessary to increase the width of the protrusion (stripe width), decrease a film thickness of a cladding layer, or decrease resistance of the cladding layer. However, when the width of the protrusion is increased, kink level is lowered. When the film thickness of the cladding layer is decreased, it causes increase of light loss. Further, it is difficult to decrease resistance of the cladding layer, since concentration of p-type carrier is hardly increased particularly in the case of nitride semiconductor.

In view of the foregoing disadvantage, in the invention, it is desirable to provide a laser diode device with which a low voltage is able to be realized.

According to an embodiment of the invention, there is provided a laser diode device including a substrate; a semiconductor laminated structure including a first conductive cladding layer, an active layer, and a second conductive cladding layer on one face side of the substrate and having a contact layer as the uppermost layer, in which a protrusion is formed in the contact layer and the second conductive cladding layer; and an electrode provided on the contact layer. The contact layer has a concavo-convex structure on a face on the electrode side, and the electrode is contacted with the contact layer at contact points of a top face, a side face, and a bottom face of the concavo-convex structure.

In the laser diode device, since the concavo-convex structure is formed on the face on the electrode side of the contact layer, the surface area of the contact layer is increased. Further, since the electrode is contacted with the contact layer at contact points of the top face, the side face, and the bottom face of the concavo-convex structure, the contact area between the electrode and the contact layer is increased. Accordingly, low voltage drive is able to be realized.

According to the laser diode device of the embodiment of the invention, since the concavo-convex structure is formed on the face on the electrode side of the contact layer, and the electrode is contacted with the contact layer at contact points of the top face, the side face, and the bottom face of the concavo-convex structure, a low voltage is able to be realized.

Other and further objects, features and advantages of the invention will appear more fully from the following description.

DETAILED DESCRIPTION OF THE PREFERRED EMBODIMENT

An embodiment of the invention will be hereinafter described in detail with reference to the drawings.

Figure 1:
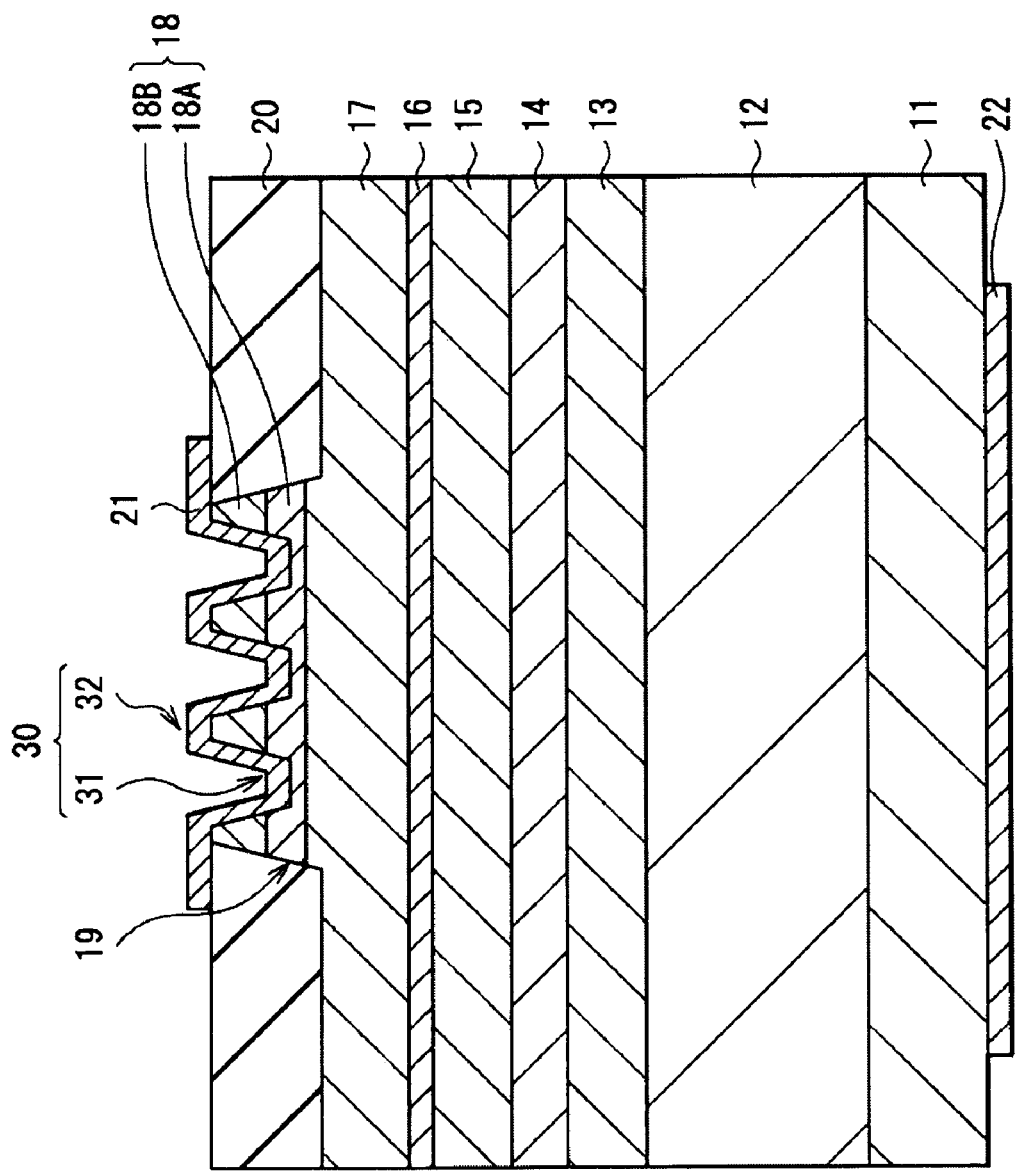
FIG. 1 is a cross sectional view illustrating a structure of a laser diode device according to an embodiment of the invention.
Figure 2:
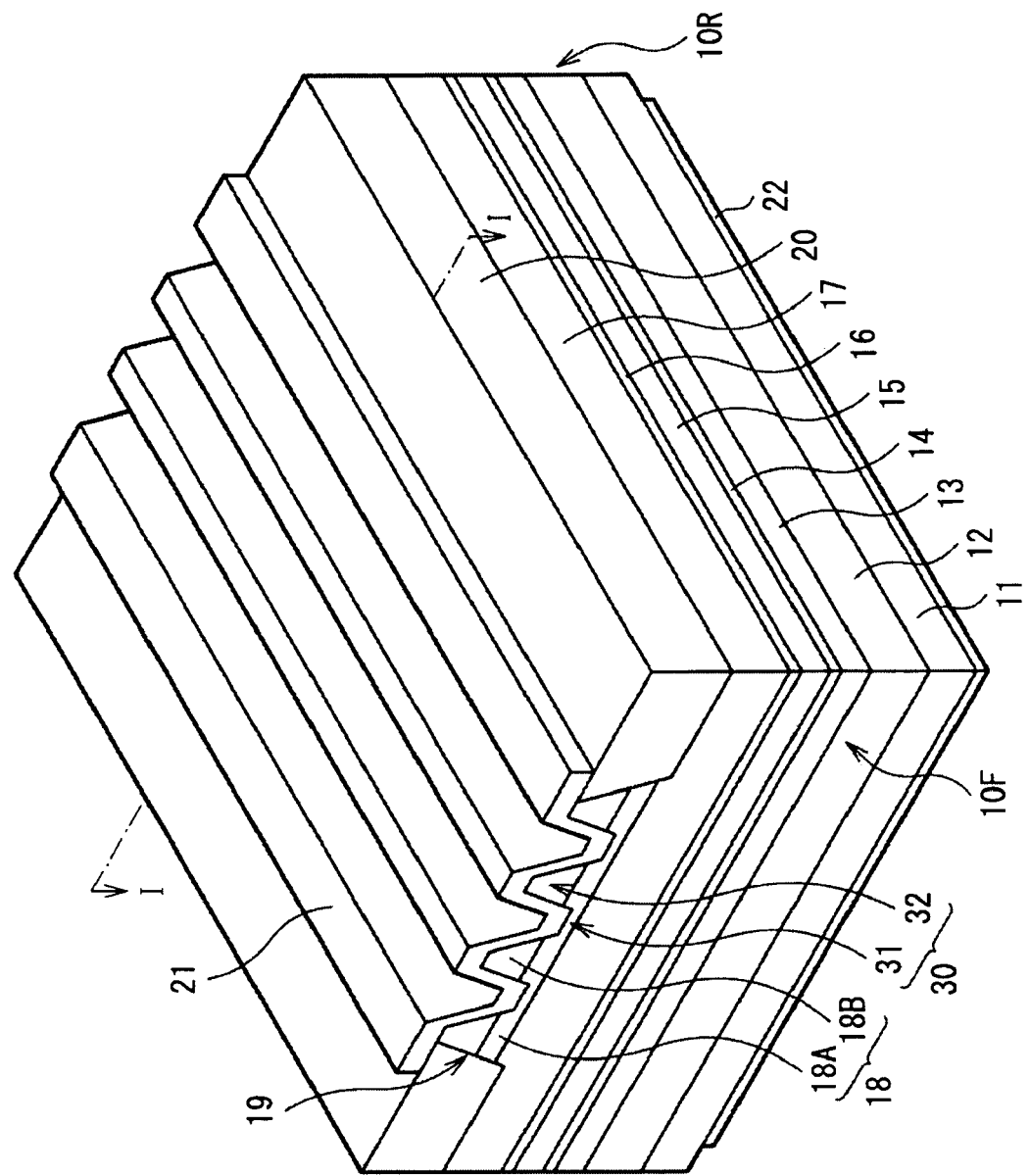
FIG. 2 is a perspective view illustrating a whole structure of the laser diode device illustrated in FIG. 1.

FIG. 1 and FIG. 2 illustrate a structure of a laser diode device according to an embodiment of the invention. The laser diode device is a blue/blue-violet laser diode device having an oscillation wavelength of about 500 nm or less, for example, around 400 nm that is used for, for example, a BD recording/reproducing laser of a personal computer, a home-use game machine and the like. For example, the laser diode device has a structure in which an n-type cladding layer 12, an n-side guide layer 13, an active layer 14, a p-side guide layer 15, an electron barrier layer 16, a p-type cladding layer 17, and a p-side contact layer 18 are layered in this order on one face side of a substrate 11 composed of GaN. In the p-side contact layer 18 and the p-type cladding layer 17, a strip-shaped protrusion 19 for current confinement is formed. A region of the active layer 14 corresponding to the protrusion 19 is a light emitting region. On both sides of the protrusion 19, a buried layer 20 having a laminated structure or a single layer structure made of a material represented by $SiO_2$ and Si is formed. On the p-side contact layer 18, a p-side electrode 21 is formed. Meanwhile, on the rear face of the substrate 11, an n-side electrode 22 is formed. The p-side contact layer 18 corresponds to a specific example of "contact layer" in the invention, and the p-side electrode 21 corresponds to a specific example of "electrode" in the invention.

The substrate 11 is composed of, for example, n-type GaN doped with silicon (Si) as n-type impurity. The n-type cladding layer 12 has, for example, a thickness in the lamination direction (hereinafter simply referred to as thickness) of from 2.5 μm to 2.6 μm both inclusive, and is composed of n-type AlGaN mixed crystal doped with silicon (Si) as n-type impurity.

The n-side guide layer 13 is, for example, 0.21 μm thick, and is composed of n-type GaN or n-type InGaN mixed crystal doped with silicon (Si) as n-type impurity, or undoped GaN or undoped InGaN mixed crystal. The active layer 14 is, for example, 0.056 μm thick, and has a multiquantum well structure composed of a well layer and a barrier layer that are respectively formed from $In_xGa_{1-x}N$ ($x \geq 0$) mixed crystal having a composition different from each other. The p-side guide layer 15 is, for example, 0.19 μm thick, and is composed of GaN or InGaN mixed crystal.

The electron barrier layer 16 is, for example, 0.02 μm thick, and is composed of p-type AlGaN mixed crystal doped with magnesium (Mg) as p-type impurity. The p-type cladding layer 17 is, for example, 0.38 μm thick, and has a superlattice structure composed of p-type AlGaN mixed crystal layer doped with magnesium (Mg) as p-type impurity and a p-type or undoped GaN layer.

The p-side contact layer 18 has a concavo-convex structure 30 on the face on the p-side electrode 21 side. The p-side electrode 21 is contacted with the p-side contact layer 18 at contact points of the top face, the side face, and the bottom face of the concavo-convex structure 30. Thereby, in the laser diode device, it is possible to achieve a low voltage.

For example, as illustrated in FIG. 1 and FIG. 2, the concavo-convex structure 30 has a stripe-shaped concavity portion 31 and a stripe-shaped convex portion 32 provided at intervals narrower than the width of the protrusion 19 in the same direction as the longitudinal direction of the protrusion 19. For example, in the case where the width of the protrusion 19 is about from 1 μm to 2 μm both inclusive, two or three cycles of the concavity portion 31 and the convex portion 32 may be provided. While the width, the distance, and the position of the concavity portion 31 and the convex portion 32 are not particularly limited, the direction thereof is desirably <1-100.> While <1-100> is originally expressed by affixing an overbar to a number as illustrated in Formula 1, in the specification, for convenience, "-" is affixed before a number.

$$<1\overline{1}00>\qquad\qquad\text{Formula 1}$$

Figure 3:
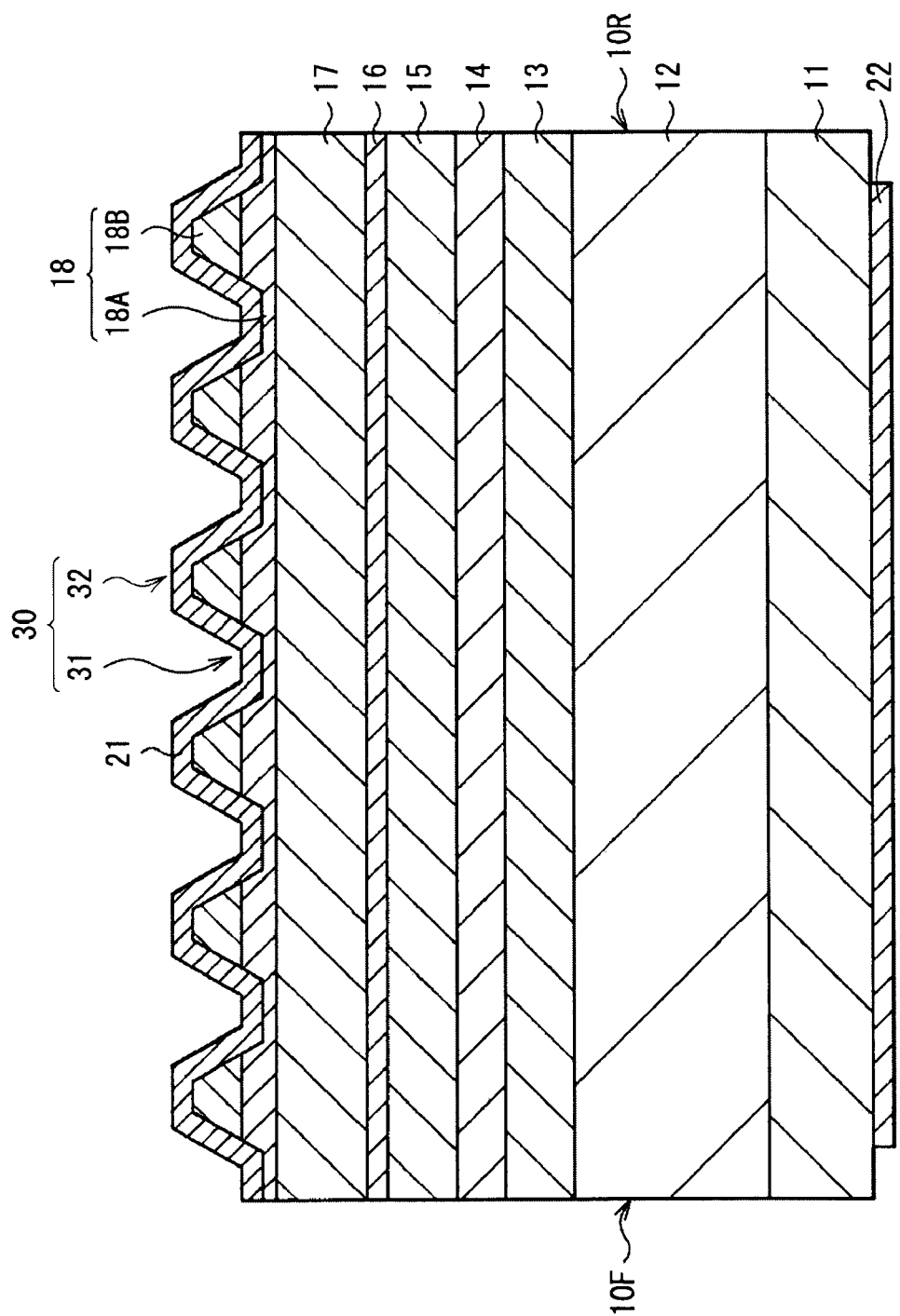
FIG. 3 is a cross sectional view illustrating a modified example of the laser diode device illustrated in FIG. 1.
Figure 4:
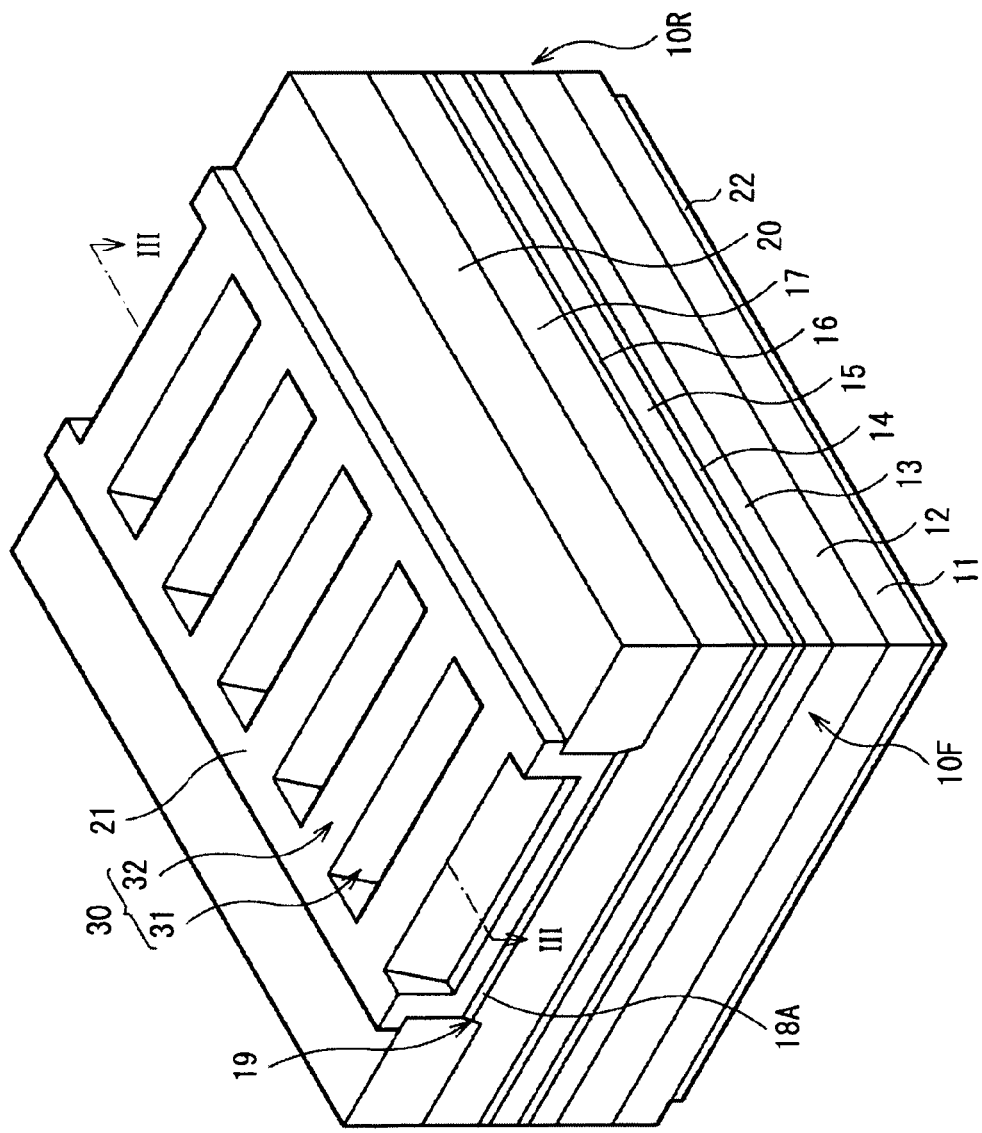
FIG. 4 is a perspective view illustrating an example of a whole structure of the laser diode device illustrated in FIG. 3.
Figure 5:
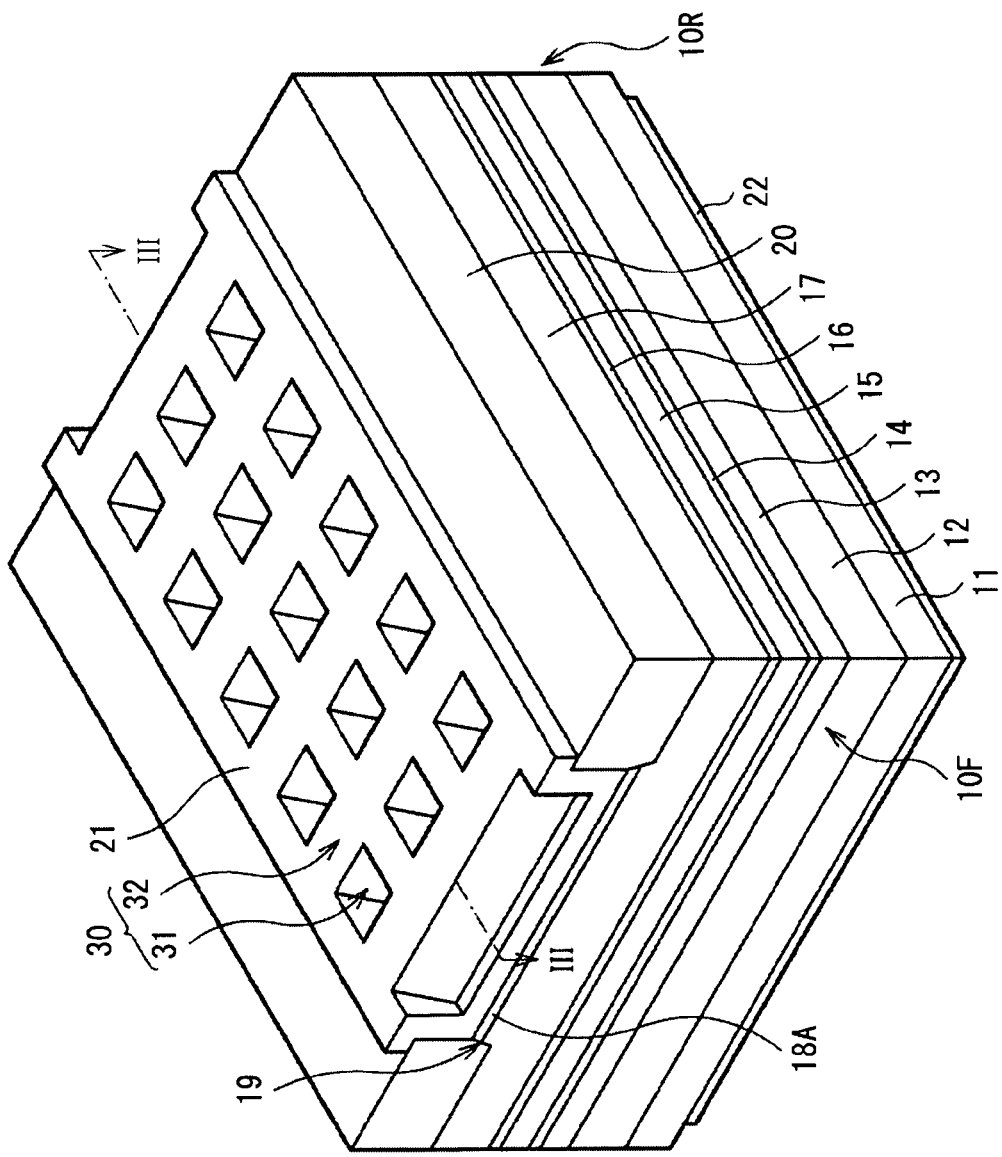
FIG. 5 is a perspective view illustrating another example of a whole structure of the laser diode device illustrated in FIG. 3.

Further, as illustrated in FIG. 3 and FIG. 4, the concavo-convex structure 30 may have the stripe-shaped concavity portion 31 and the stripe-shaped convex portion 32 provided in the direction crossing (perpendicular to) the longitudinal direction of the protrusion 19. Otherwise, as illustrated in FIG. 3 and FIG. 5, the concavo-convex structure 30 may have a structure in which the plurality of island-like concavity portions 31 exist and a region other than the concavity portions 31 may be the convex portion 32. Thereby, the number of the concavity portion 31 and the convex portions 32 becomes larger, and the voltage may be further reduced.

The p-side contact layer 18 is composed of a binary (or more) composition containing Ga such as BAlInGaN system. Further, the p-side contact layer 18 has a laminated structure composed of a plurality of layers (for example, two layers). The plurality of layers have a strain difference since the plurality of layers are composed of each $In_xGa_{1-x}N$ ($x \geq 0$) mixed crystal having a composition different from each other, or AlGaN mixed crystal with lower aluminum (Al) composition ratio than that of the p-type cladding layer 17.

Specifically, in the p-side contact layer 18, a first p-side contact layer 18A composed of $In_{0.05\sim0.10}Ga_{0.95\sim0.90}N$ mixed crystal doped with magnesium (Mg) as p-type impurity and a second p-side contact layer 18B composed of $In_{0.20}Ga_{0.80}N$ mixed crystal doped with magnesium (Mg) as p-type impurity are layered in this order from the p-type cladding layer 17 side.

Otherwise, the p-side contact layer 18 may have a structure in which the first p-side contact layer 18A composed of GaN doped with magnesium (Mg) as p-type impurity and the second p-side contact layer 18B composed of $In_{0.20}Ga_{0.80}N$ mixed crystal doped with magnesium (Mg) as p-type impurity are layered in this order from the p-type cladding layer 17 side.

Further, the p-side contact layer 18 may have a structure in which the first p-side contact layer 18A composed of AlGaN mixed crystal that is doped with magnesium (Mg) as p-type impurity and has a lower aluminum composition ratio than that of the p-type cladding layer 17 and the second p-side contact layer 18B composed of $In_{0.20}Ga_{0.80}N$ mixed crystal doped with magnesium (Mg) as p-type impurity or GaN are layered in this order from the p-type cladding layer 17 side.

The p-side contact layer 18 is, for example, 0.10 μm thick as a total of the thickness of the first p-side contact layer 18A and the thickness of the second p-side contact layer 18B.

The concavo-convex structure 30 preferably has a height striding across the first p-side contact layer 18A and the second p-side contact layer 18B of the p-side contact layer 18. This is because the p-side electrode 21 is contacted with the p-side contact layer 18 at contact points of the top face, the side face, and the bottom face of the concavo-convex structure 30 having such a height, contact resistance is decreased, and the resistance is reduced.

Figure 6:
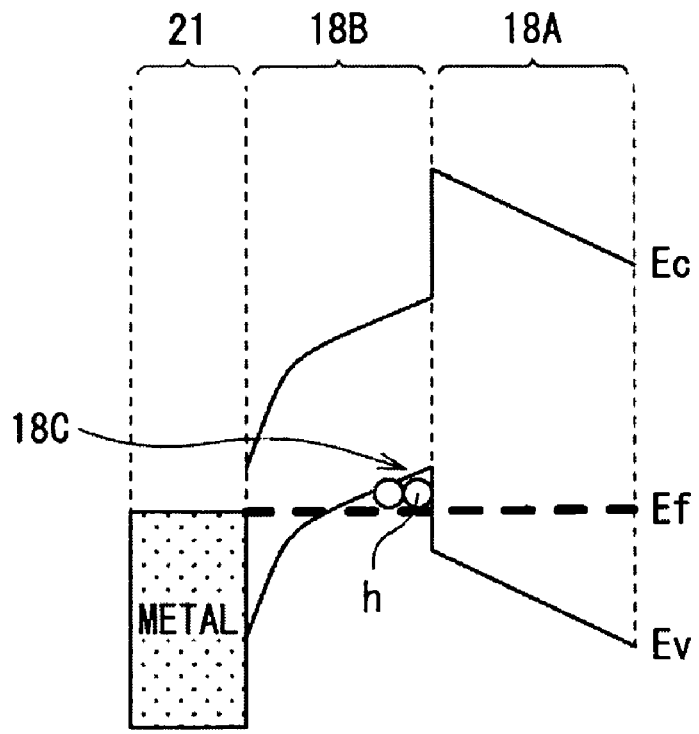
FIG. 6 is a diagram illustrating a band structure in the vertical direction in a first p-side contact layer and a second p-side contact layer in the case where a concavo-convex structure is not included.

FIG. 6 illustrates a band structure in the vertical direction in the first p-side contact layer 18A and the second p-side contact layer 18B in the case where the concavo-convex structure is not included. The p-side contact layer 18 has piezo field effect due to a strain difference between the first p-side contact layer 18A and the second p-side contact layer 18B. Thus, between the first p-side contact layer 18A and the second p-side contact layer 18B, a carrier accumulation layer 18C in which a hole h is accumulated is formed, and fermi level Ef is degenerated to valence band. However, between the p-side electrode 21 (metal) and the second p-side contact layer 18B, a Schottky barrier exists and a depletion layer is spread.

Figure 7:
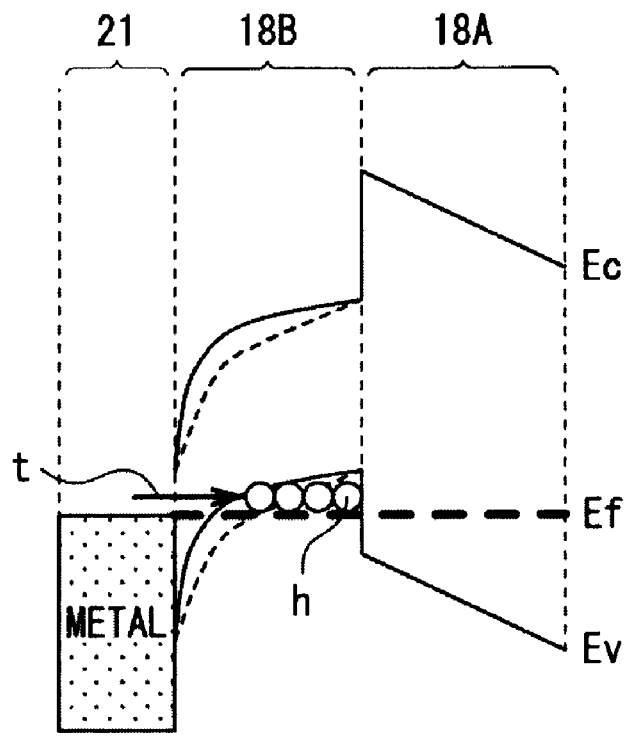
FIG. 7 is a diagram illustrating a band structure in the vertical direction in the case where the carrier concentration of the second p-side contact layer is increased in FIG. 5.

In a material system having such a Schottky barrier, as illustrated in FIG. 7, by increasing the carrier concentration of the second p-side contact layer 18B, the width of the depletion layer may be narrowed, and ohmic contact may be obtained by a tunnel current t. However, in the nitride semiconductor, active energy of an acceptor is high, and it is inherently difficult to increase concentration of the hole h of the second p-side contact layer 18B. Further, the nitride semiconductor has a large energy difference between the vacuum level and the valence band. To obtain the ohmic contact, a metal having a large work function is selected as a material of the p-side electrode 21, which does not contribute sufficiently.

Figure 8:
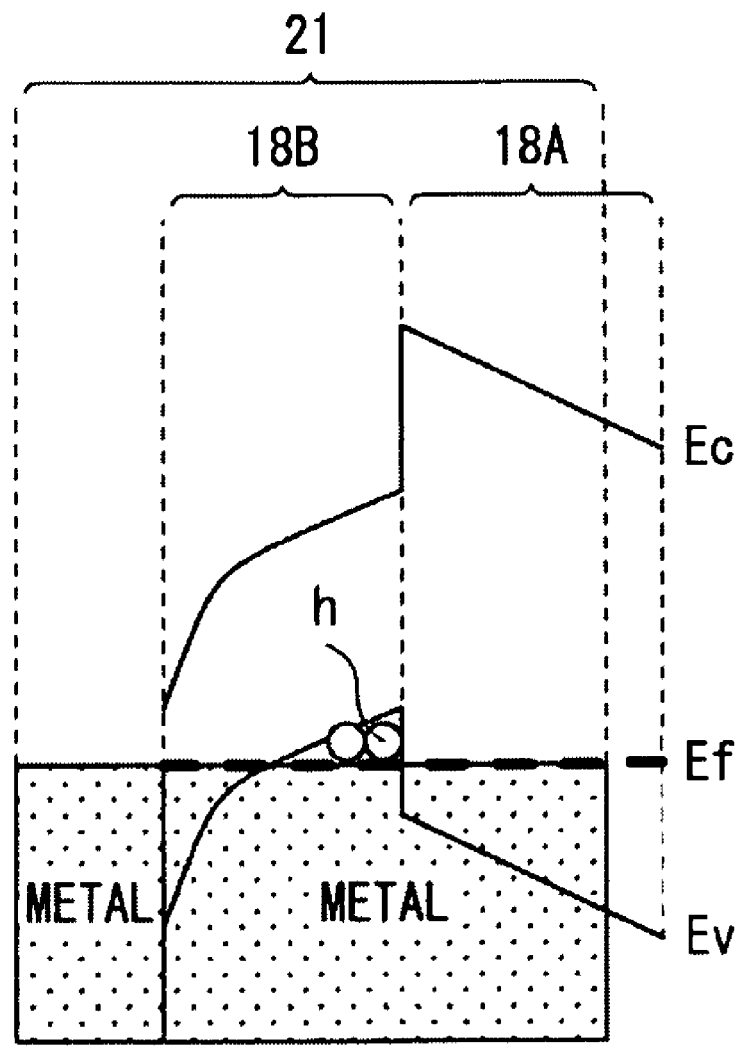
FIG. 8 is a diagram illustrating a band structure in the vertical direction in the case where the concavo-convex structure has a height striding across the first p-side contact layer and the second p-side contact layer, and the p-side electrode is contacted with the p-side contact layer at contact points of the side face of the concavo-convex structure.

FIG. 8 illustrates a band structure in the vertical direction in the case where the concavo-convex structure 30 has a height striding across the first p-side contact layer 18A and the second p-side contact layer 18B, and the p-side electrode 21 (metal) is contacted with the p-side contact layer 18 at contact points of the side face of the concavo-convex structure 30. In this case, in the side face of the concavo-convex structure 30, the p-side electrode 21 is contacted with the p-side contact layer 18 at contact points of the carrier accumulation layer 18C having a high hole concentration with the degenerated fermi level Ef. Thus, in the carrier accumulation layer 18C, ideal ohmic contact without the Schottky barrier is able to be realized. In practice, due to defect of the interface between the p-side electrode 21 and the p-side contact layer 18, the Schottky barrier is formed. However, since the high concentrated carrier exists in the carrier accumulation layer 18C, the width of the depletion layer is sufficiently narrowed, a tunnel current is easily flown, and contact resistance is decreased.

The p-side electrode 21 illustrated in FIG. 1 and FIG. 2 has, for example, a structure in which palladium (Pd), platinum (Pt), and gold (Au) are sequentially layered from the p-side contact layer 18 side, and is electrically connected to the p-side contact layer 18. The n-side electrode 22 has, for example, a structure in which titanium (Ti), platinum (Pt), and gold (Au) are sequentially layered. The n-side electrode 22 is electrically connected to the n-type cladding layer 12 with the substrate 11 in between. Materials of the p-side electrode 21 and the n-side electrode 22 are not limited to the foregoing combinations of metal materials, but may be a combination of other metal materials.

In the laser diode device, for example, a pair of side faces opposed to each other in the longitudinal direction of the protrusion 19 is resonator end faces (a main emitting side end face 10F and a rear end face 10R). On the pair of resonator end faces (the main emitting side end face 10F and the rear end face 10R), a pair of reflecting mirror films (not illustrated) is respectively formed. Of the pair of reflecting mirror films, one reflecting mirror film is adjusted to have lower reflectance, and the other reflecting mirror film is adjusted to have higher reflectance. Thereby, light generated in the active layer 14 shuttles between the pair of reflecting mirror films, is amplified, and is emitted as a laser beam from the one of the reflecting mirror film.

The laser diode may be manufactured, for example, as follows.

Figure 9:
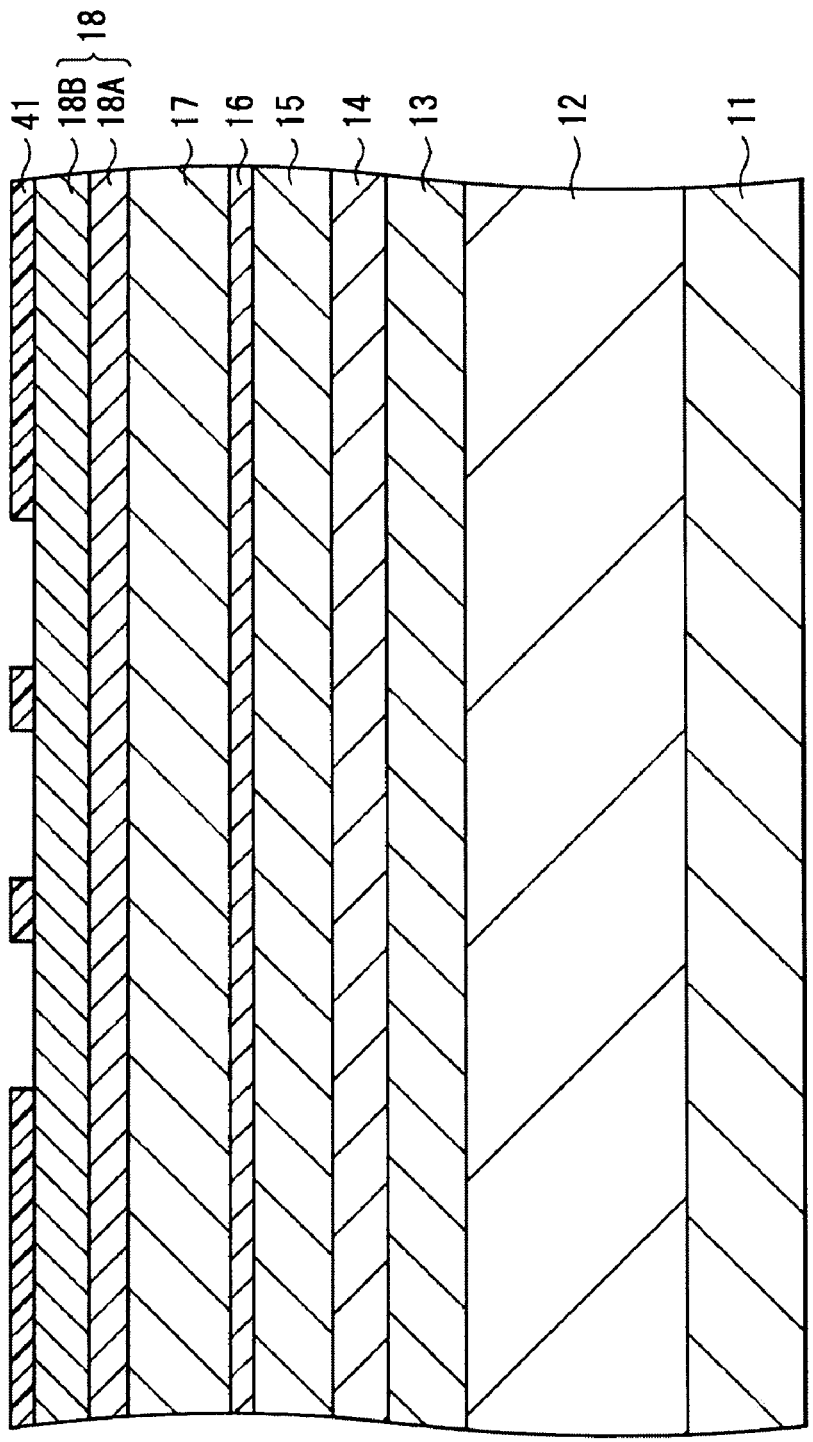
FIG. 9 is a cross sectional view illustrating a method of manufacturing the laser diode device illustrated in FIG. 1 in the order of steps.

First, for example, as illustrated in FIG. 9, the substrate 11 composed of GaN is prepared. On the surface of the substrate 11, for example, by MOCVD (Metal Organic Chemical Vapor Deposition) method, the n-type cladding layer 12, the n-side guide layer 13, the active layer 14, the p-side guide layer 15, the electron barrier layer 16, the p-type cladding layer 17, the first p-side contact layer 18A, and the second p-side contact layer 18B composed of the foregoing material are grown.

Next, as illustrated in FIG. 9 again, a mask 41 made of a resist is formed on the second p-side contact layer 18B.

Figure 10:
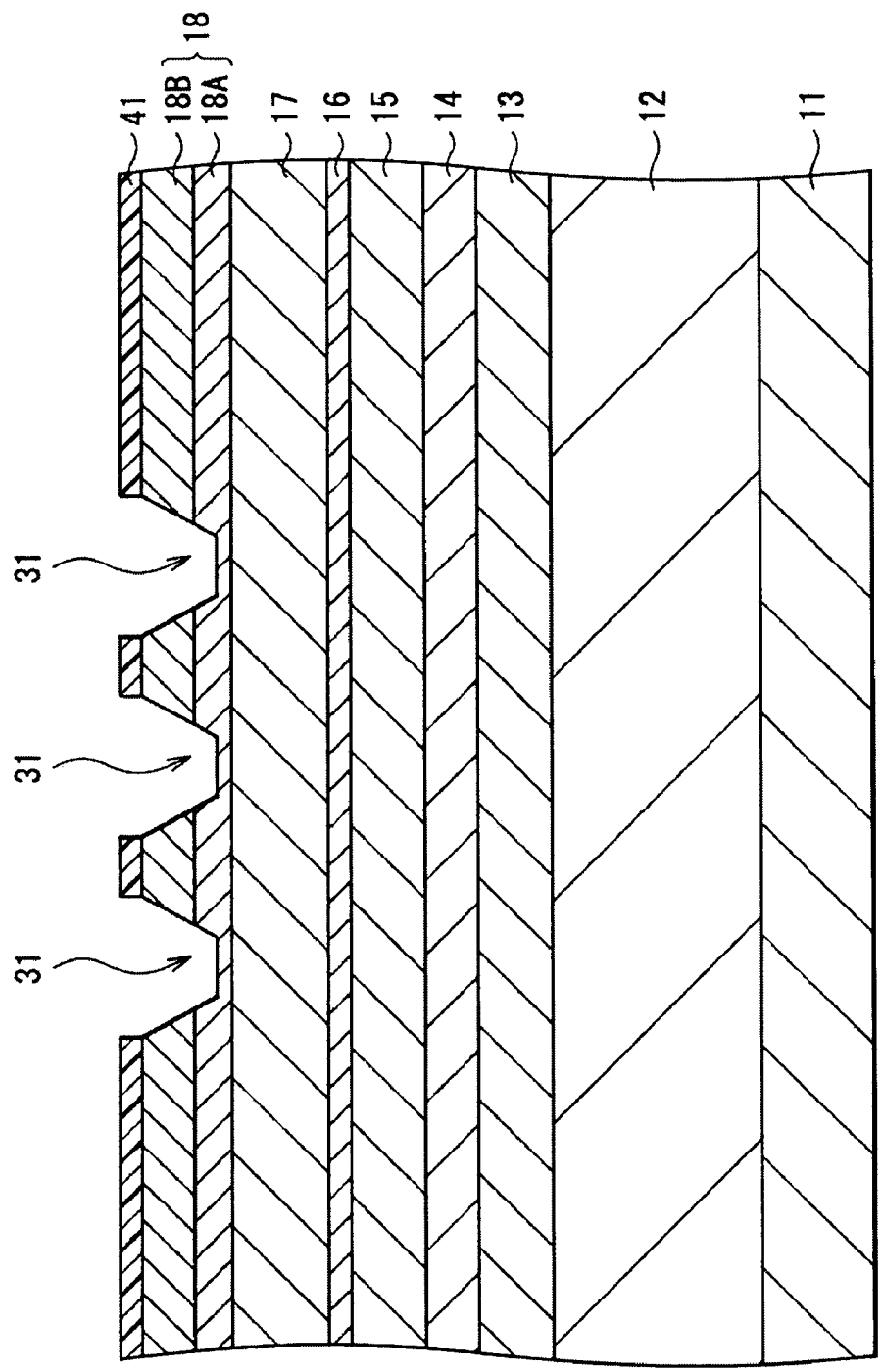
FIG. 10 is a cross sectional view illustrating a step following FIG. 9.

Subsequently, as illustrated in FIG. 10, by using the mask 41, the second p-side contact layer 18B and part of the first p-side contact layer 18A are selectively etched by, for example, RIE (Reactive Ion Etching) method to form the concavity portion 31. Thereby, in the p-side contact layer 18, the concavo-convex structure 30 in which the concavity portion 31 and the convex portion 32 are alternately arranged is formed. At this time, according to the selection of etching mode of RIE, slope angle of the side face of the concavo-convex structure 30 may be arbitrarily formed.

Figure 11:
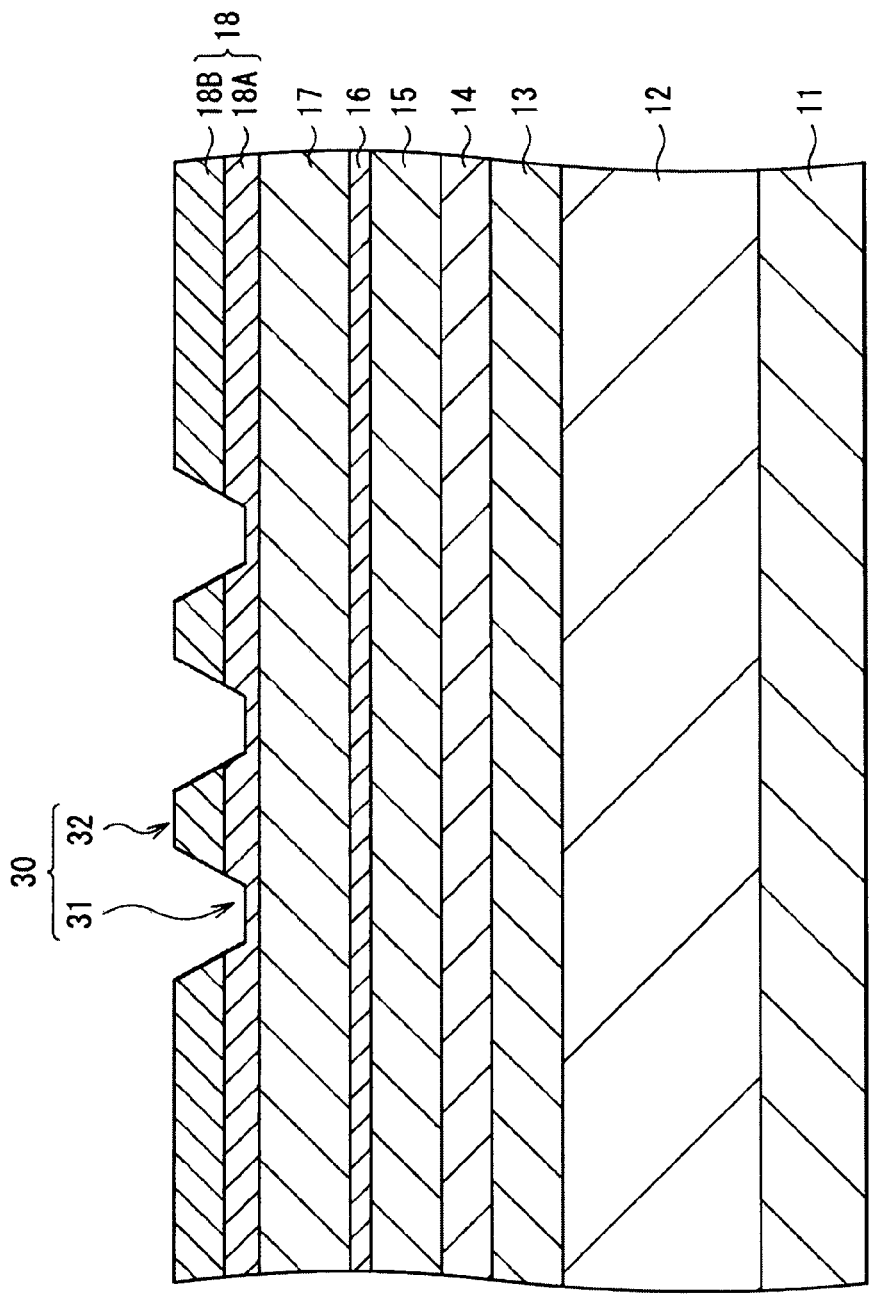
FIG. 11 is a cross sectional view illustrating a step following FIG. 10.

After that, as illustrated in FIG. 11, the mask 41 is separated by using acetone.

Figure 12:
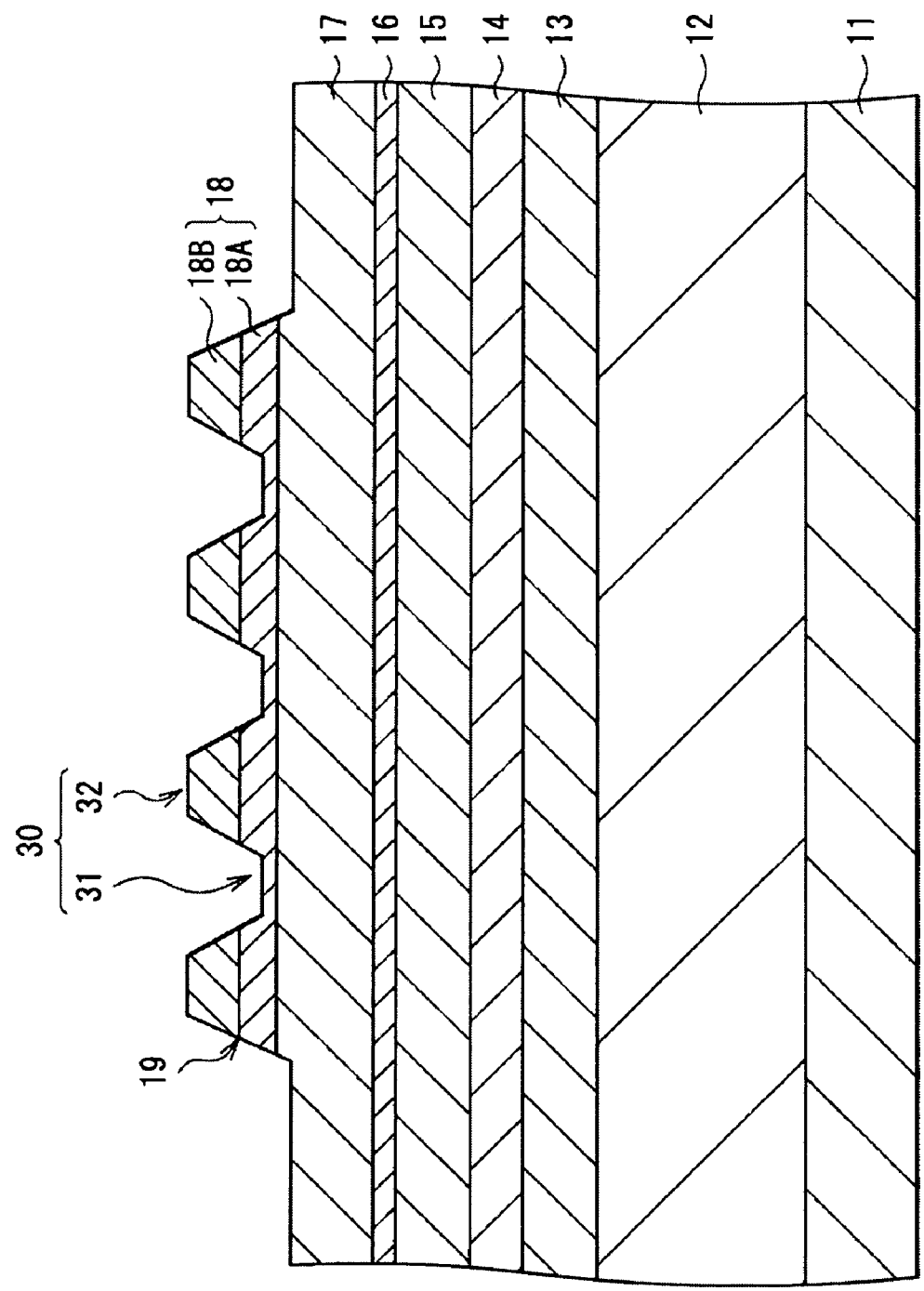
FIG. 12 is a cross sectional view illustrating a step following FIG. 11.

After the mask 41 is separated, a mask (not illustrated) is formed on the protrusion 19. By using the mask, the p-side contact layer 18 and part of the p-type cladding layer 17 are selectively etched by, for example, RIE method. Thereby, as illustrated in FIG. 12, the upper portion of the p-type cladding layer 17 and the p-side contact layer 18 are formed into a narrow strip-shaped protrusion 19. At this time, it is desirable that after RIE, surface treatment (surface cleaning) of the dry-etched surface is performed by using an acid solution such as HF, HCl, and royal water.

Subsequently, on the p-type cladding layer 18 and the p-side contact layer 17, the buried layer 20 made of the foregoing material is formed. In the buried layer 20, an aperture is provided correspondingly to the p-side contact layer 18 to form the p-side electrode 21. Further, the rear face side of the substrate 11 is, for example, lapped or polished so that the thickness of the substrate 11 becomes, for example, about 100 µm. After that, the n-side electrode 22 is formed on the rear face of the substrate 11. After that, the substrate 11 is formed into a given size, and the reflecting mirror films (not illustrated) are formed on the pair of opposed resonator end faces 10F and 10R. Accordingly, the laser diode device illustrated in FIG. 1 is completed.

In the laser diode, when a given voltage is applied between the n-side electrode 22 and the p-side electrode 21, a current is injected into the active layer 14, and light is emitted by electron-hole recombination. The light is reflected by the pair of reflecting mirror films, shuttles therebetween, generates laser oscillation, and is emitted outside as a laser beam. In this embodiment, the concavo-convex structure 30 is formed on the face on the p-side electrode 21 side of the p-side contact layer 18. Thus, the surface area of the p-side contact layer 18 is increased. Further, the p-side electrode 21 is contacted with the p-side contact layer 18 at contact points of the top face, the side face, and the bottom face of the concavo-convex structure 30. Thereby, the contact area between the p-side electrode 21 and the p-side contact layer 18 is increased. Accordingly, a low voltage drive is able to be realized.

Further, the concavo-convex structure 30 has a height striding across the first p-side contact layer 18A and the second p-side contact layer 18B. Thus, in the side face of the concavo-convex structure 30, as illustrated in FIG. 8, the p-side electrode 21 is contacted with the p-side contact layer 18 at contact points of the carrier accumulation layer 18C having a high hole concentration with degenerated fermi level Ef. Accordingly, contact resistance is decreased.

As described above, in this embodiment, the concavo-convex structure 30 is formed on the face on the p-side electrode 21 side of the p-side contact layer 18. Further, the p-side electrode 21 is contacted with the p-side contact layer 18 at contact points of the top face, the side face, and the bottom face of the concavo-convex structure 30. Accordingly, a low voltage is able to be realized.

Further, the concavo-convex structure 30 has a height striding across the first p-side contact layer 18A and the second p-side contact layer 18B. Thus, due to the concavo-convex structure 30, both decreased contact resistance and a low voltage are able to be realized.

Descriptions have been hereinbefore given of the invention with reference to the embodiment. However, the invention is not limited to the foregoing embodiment, and various modifications may be made. For example, in the foregoing embodiment, the description has been given of the case that the p-side contact layer 18 has the two layer structure composed of the first p-side contact layer 18A and the second p-side contact layer 18B. However, the p-side contact layer 18 may have a laminated structure including three or more layers. In this case, the concavo-convex structure 30 preferably has a height striding across two or more layers out of the three or more layers.

Figure 13:
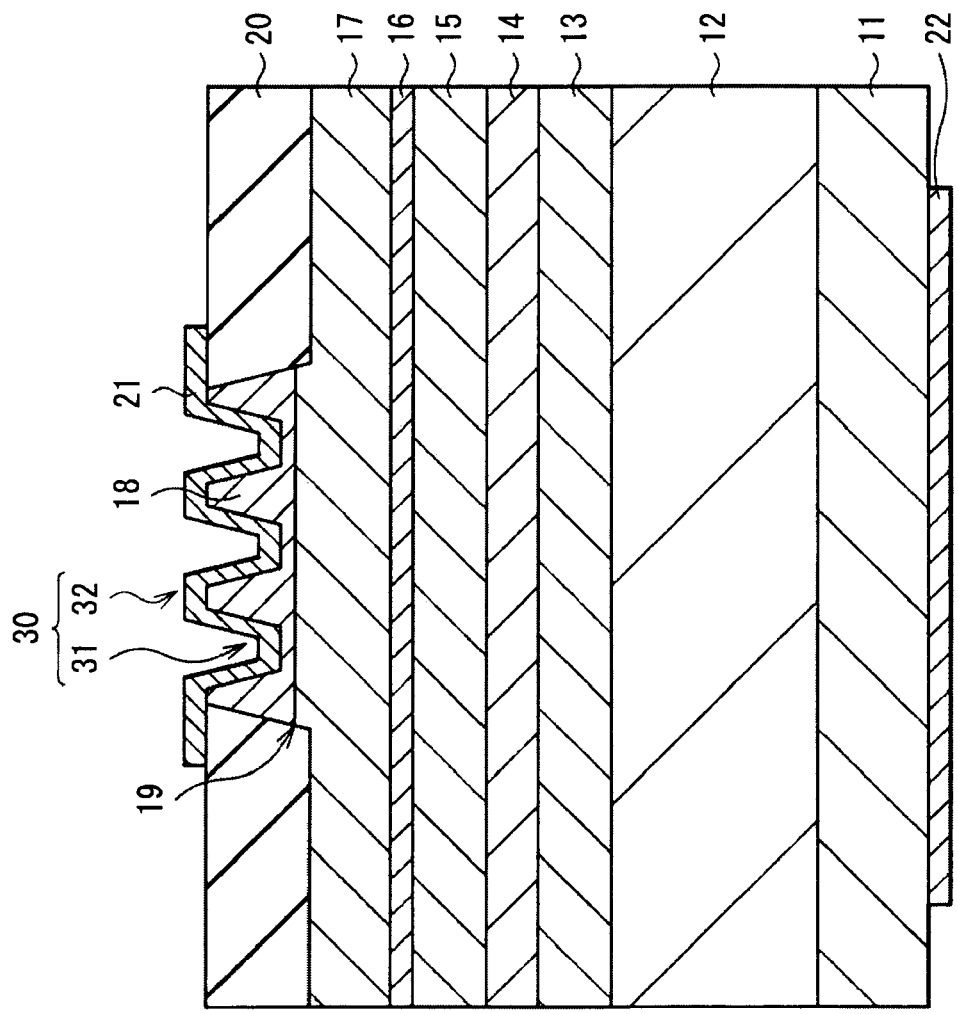
FIG. 13 is a cross sectional view illustrating another modified example of the laser diode device illustrated in FIG. 1.

Further, in the foregoing embodiment, the description has been given of the case that the p-side contact layer 18 has the laminated structure composed of a plurality of layers having strain difference. However, as illustrated in FIG. 13, the p-side contact layer 18 may be a single layer that is 0.10 µm thick and is composed of p-type GaN doped with magnesium (Mg) as p-type impurity. In this case, by providing the concavo-convex structure 30, the surface area of the p-side contact layer 18 is increased, and a low voltage is enabled.

Further, for example, the material, the thickness, the film formation methods, the film formation conditions and the like of the respective layers described in the foregoing embodiment are not limited, but other material, other thickness, other film formation method, and other film formation conditions may be used. For example, in the foregoing embodiment, the description has been given of the case that the n-type cladding layer 12 and the p-side contact layer 18 are formed by MOCVD method. However, MBE (Molecular Beam Epitaxy) method or the like may be used.

In addition, for example, in the foregoing embodiment, the structure of the laser diode device has been described with the specific example. However, it is not necessary to provide all layers, or other layer may be further provided.

Furthermore, the invention is not limited to the blue/blue-violet laser diode composed of nitride Group III-V compound semiconductor containing at least gallium (Ga) out of Group III elements and at least nitrogen (N) out of Group V elements as described above, but is applicable to a higher output laser diode, a laser diode having other oscillation wavelength, or a laser diode made of other material system. For example, Group II-IV oxide semiconductor containing at least zinc (Zn) out of Group II elements and at least oxygen (O) out of Group IV elements is wide band gap semiconductor in which carrier concentration is hardly increased inherently as the nitride semiconductor is. Thus, in the case where the invention is applied to such oxide semiconductor, superior effect similar to that of the nitride laser diode described in the foregoing embodiment is obtainable. In this case, the p-side contact layer is composed of a binary (or more) composition containing Zn such as BeCdZnMgO system.

The present application contains subject matter related to that disclosed in Japanese Priority Patent Application JP 2009-051959 filed in the Japan Patent Office on May 5, 2009, the entire contents of which is hereby incorporated by reference.

It should be understood by those skilled in the art that various modifications, combinations, sub-combinations and alternations may occur depending on design requirements and other factors insofar as they are within the scope of the appended claims or the equivalents thereof.

What is claimed is:

1. A laser diode device comprising:
a substrate;
a semiconductor laminated structure including a first conductive cladding layer, an active layer, and a second conductive cladding layer on one face side of the substrate and having a contact layer as the uppermost layer, in which a protrusion is formed in the contact layer and the second conductive cladding layer; and
an electrode provided on the contact layer, wherein
the contact layer has a concavo-convex structure on a face on the electrode side, and
the electrode is contacted with the contact layer at contact points of a top face, a side face, and a bottom face of the concavo-convex structure.

2. The laser diode device according to claim 1, wherein the contact layer has a laminated structure including a plurality of layers having a strain difference, and the concavo-convex structure has a height striding across two or more layers out of the plurality of layers.

3. The laser diode device according to claim 2, wherein the contact layer has piezo field effect.

4. The laser diode device according to claim 1, wherein the concavo-convex structure has a stripe-shaped concavity portion and a stripe-shaped convex portion provided to have a narrower width than a width of the protrusion in the same direction as a longitudinal direction of the protrusion.

5. The laser diode device according to claim 1, wherein the concavo-convex structure has a stripe-shaped concavity portion and a stripe-shaped convex portion provided in a direction crossing a longitudinal direction of the protrusion.

6. The laser diode device according to claim 1, wherein the concavo-convex structure has a plurality of island-like concavity portions and a convex portion other than the concavity portions.

7. The laser diode device according to claim 1, wherein the semiconductor laminated structure is composed of nitride Group III-V compound semiconductor containing at least gallium (Ga) out of Group III elements and at least nitrogen (N) out of Group V elements, and
the contact layer is composed of a binary (or more) composition containing Ga such as BAlInGaN system.

8. The laser diode device according to claim 1, wherein the semiconductor laminated structure is composed of Group II-IV oxide semiconductor containing at least zinc (Zn) out of Group II elements and at least oxygen (O) out of Group IV elements, and
the contact layer is composed of a binary (or more) composition containing Zn such as BeCdZnMgO system.

* * * * *